United States Patent
Imai

(10) Patent No.: US 6,469,577 B2
(45) Date of Patent: Oct. 22, 2002

(54) AUTOMATIC LEVEL CONTROLLING CIRCUIT

(75) Inventor: Katsumi Imai, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/832,618

(22) Filed: Apr. 11, 2001

(65) Prior Publication Data

US 2001/0030576 A1 Oct. 18, 2001

(30) Foreign Application Priority Data

Apr. 14, 2000 (JP) .................................. 2000-114150
Apr. 14, 2000 (JP) .................................. 2000-114192

(51) Int. Cl.[7] .................................................. H03G 3/20
(52) U.S. Cl. .................................. 330/140; 330/141
(58) Field of Search .......................... 330/129, 140, 330/141, 281; 327/318

(56) References Cited

U.S. PATENT DOCUMENTS

| | | | | |
|---|---|---|---|---|
| 4,760,347 A | * | 7/1988 | Li et al. ........................ | 330/140 |
| 5,128,629 A | * | 7/1992 | Trinh .......................... | 330/141 |
| 5,652,547 A | * | 7/1997 | Mokhtar et al. ............. | 330/140 |
| 5,724,003 A | * | 3/1998 | Jensen et al. ................ | 330/140 |
| 6,084,920 A | * | 7/2000 | Ferdinandsen ............... | 330/140 |
| 6,208,209 B1 | * | 3/2001 | Ng ............................... | 330/281 |

* cited by examiner

Primary Examiner—Robert Pascal
Assistant Examiner—Khanh Van Nguyen
(74) Attorney, Agent, or Firm—Fish & Richardson P.C.

(57) ABSTRACT

A limiter circuit is provided for limiting the output from a comparing circuit so that the attenuating characteristic curve of an amplifying circuit 11 relative to a detected voltage Vo has an inflection point. Namely, since the limiter circuit serves to limit a difference voltage between the outputs from differential transistors, it reduces the sensitivity of the attenuating characteristic within a region from a high level signal to a middle level signal. Thus, the detected voltage Vo increases for acquiring the same attenuating amount so that the recovery time can be prolonged. Further, another limiter circuit is provided for fixing a detected voltage Vo at a prescribed DC voltage when the input signal exceeding a cover range for automatic level control is supplied to the input terminal. The limiter circuit operates to fix the output signal at a DC voltage $V_L$ when the input signal exceeds the cover range and enters the range where the level of the output signal starts to rise.

9 Claims, 7 Drawing Sheets

RECOVERY CHARACTERISTIC 1

RECOVERY CHARACTERISTIC 2

AUTOMATIC LEVEL CONTROLLING CIRCUIT

BACKGROUND OF THE INVENTION

This invention relates to an automatic level controlling (ALC) circuit for controlling an output signal to a stable level when the level of an input signal such as an audio signal is high.

Generally, sound in the external environment includes a faint sound and loud sound. In the processing of an audio input signal, since it is necessary to assure a wide dynamic range, when the level of the audio input signal is high, it was controlled to a stable level by an automatic level control circuit. In a digital video camera which has spread in recent years, making a low voltage operation has been attempted for reduction of power consumption. It has been demanded for the characteristic of the automatic level controlling circuit to be improved to assure a wide dynamic range.

FIG. 4 is a circuit diagram of a conventional automatic level controlling circuit. In FIG. 4, reference numeral 10 denotes an input terminal to which an audio input signal is supplied; 11 an amplifying circuit for amplifying the input signal; 12 a full-wave rectifying circuit for full-wave rectifying an output from the amplifying circuit; 13 a buffer amplifier; and 14 a detecting terminal to which a capacitor 15 is externally attached. The full-wave rectifying circuit 12 and the capacitor 15 connected to the detecting terminal 14 constitute a detecting circuit. Reference numeral 16 denotes a comparing circuit for comparing a detected voltage Vo appearing at the detecting terminal 14 and a reference voltage Vref from a DC power source. The comparing circuit 16 produces a controlling voltage for controlling the gain of the amplifying circuit 11 according to a comparison result, thereby controlling the level of the output signal therefrom.

FIG. 5 is an input/output characteristic graph of the automatic level controlling circuit having the configuration described above. As seen from FIG. 5, in the absence of the automatic level controlling circuit, the output signal exceeds a saturated level Vs when the level of the input signal exceeds V1, and hence is clipped. On the other hand, in the presence of the automatic level controlling circuit, it restrains the level of the output signal when the level of the input signal reaches V2 so that clipping of the output signal can be prevented.

The characteristic of the automatic level controlling circuit is characterized by not only the above input/output characteristic but also the transient response characteristic when the level of the input signal has changed abruptly, i.e. attack/recovery characteristic.

FIGS. 6A and 6B are waveform charts for explaining the attack characteristic. As seen from FIG. 6A, when the level of the input signal rises abruptly at a time t1, it is amplified instantaneously with a full gain. Then, as seen from FIG. 6B, the level of the output signal is clipped. However, the level is attenuated gradually through the automatic level control operation. In this case, the time taken to reach the stable level, or the time taken until the clipping of the level of the output signal is canceled is called "attack time $T_A$". The attack time is controlled by a CR time constant of the detecting circuit.

FIGS. 7A and 7B are waveform charts for explaining the recovery characteristic. As seen from FIG. 7A, it is assumed that the level of the input signal has decreased abruptly at time t3. Then, it takes a time for the level of the output signal to restore to the ordinary recovery time (t4). This time is called "recovery time $T_R$". In this case, a current flows through a discharging current path (not shown) so that the detected voltage Vo at the detecting terminal decreases.

Where the sensitivity of the automatic level control circuit is high (attack/recovery time is short), the distortion of the output signal increases. On the other hand, where the sensitivity is low (attack/recovery time is long), the output signal disappears. In this way, the performance of the automatic level control circuit is defined by various attack/recovery characteristic.

FIG. 8 is a graph showing the relationship between the detected voltage Vo and the attenuating quantity from the output from the amplifying circuit 11, i.e. an example of the attenuating characteristic curve. This attenuating characteristic curve can be acquired in such a manner that with the input signal fixed to a certain level, the detected voltage Vo is forcibly changed so that the attenuating quantity of the output from the amplifying circuit 11 is measured. The attenuating characteristic curve shown in FIG. 8 exhibits a characteristic attenuating abruptly when the detected voltage increases, in other words, a characteristic suppressing the output signal strongly. However, the automatic level control circuit having such an attenuating characteristic curve gave rise to the following problem.

Generally, as seen from FIGS. 9A and 9B, the recovery characteristic is defined by the recovery time $T_{R1}$ when the input signal is switched from a middle level signal into a low level signal (reference input signal). FIG. 9A shows the input signal and FIG. 9B shows the response of the output signal (recovery characteristic No. 1).

However, if the input signal is adapted to such a recovery characteristic, the recovery time $T_{R2}$ when the input signal is switched from a high level signal into the middle level signal becomes very short. FIGS. 10A and 10B show such a recovery characteristic. Specifically, FIG. 10A shows the input signal and FIG. 10B shows the response of the output signal (recovery characteristic No. 2). Therefore, when the input signal is switched from the high level signal into the middle level signal, signal distortion occurs. Particularly, in the case of an audio signal, an uncomfortable phenomenon of "sound breakage" occurs.

Further, as seen from FIG. 11, the automatic level controlling circuit has a prescribed cover range for an input signal. Specifically, if the input signal is within the cover range, the level of the output signal is limited to a prescribed level. According to the kind of the input signal, it may exceed drastically from the cover range. In this case, it is inevitable that the output signal generates distortion.

However, thereafter, when the level of the input signal becomes low, the time taken for the output signal to restore to a normal stable level, i.e. recovery time will become very long. This problems can be analyzed in detail as follows. As seen from FIG. 11, the detected voltage Vo raises as the level of the input signal rises, thereby limiting the level of the output signal. FIG. 12 is a graph showing a relationship between the detected voltage Vo and an attenuating amount in the output from the amplifier 11. The attenuating amount can be measured by changing the detected voltage Vo with the input signal fixed at a prescribed level. In such an attenuating characteristic, when the detected voltage reaches a saturated region (where the attenuating amount does not vary even when the detected voltage increases), the level of the output signal cannot be limited to a prescribed level and the detected voltage Vo rises abnormally. This greatly prolongs the recovery time.

SUMMARY OF THE INVENTION

This invention has been accomplished in view of the inconvenience of the prior art described above. This invention intends to control appropriately the recovery characteristic when an input signal is switched from a high level signal into a middle level signal, thereby minimizing signal distortion.

Further, this invention intends to prevent an abnormal rise in the detected voltage Vo even when the level of the input signal exceeds the cover range, so that the recovery time is shortened to produce an normal output signal.

According to the present invention, the automatic level controlling circuit comprises: an amplifying circuit for amplifying an input signal to produce an output signal therefrom; a detecting circuit for detecting the output signal from said amplifying circuit to produce a detected voltage in a DC level; a comparing circuit for comparing the detected voltage with a first reference voltage to produce a control voltage so that an output level from said amplifying circuit is regulated on the basis of said control voltage, wherein it further comprises a limiter circuit for limiting the control voltage from said comparing circuit so that an attenuating characteristic curve of said amplifying circuit relative to said detected voltage has an inflection point.

In such a configuration of the automatic level control circuit, even when the recovery time is set at the case where the input signal has been switched from the middle level signal into the low level signal (reference input signal), the recovery time when the input signal has been switched from the high level signal into the middle level signal can be prolonged. This permits the signal distortion to be minimized and the "sound breakage" to be relaxed in the case of the audio signal.

Further, according to the present invention, the automatic level controlling circuit comprises: an amplifying circuit for amplifying an input signal to produce an output signal therefrom; a detecting circuit for detecting the output signal from said amplifying circuit to produce a detected voltage in a DC level; a comparing circuit for comparing the detected voltage with a first reference voltage to produce a control voltage so that an output level from said amplifying circuit is regulated on the basis of said control voltage, wherein it further comprises a limiter circuit for fixing said detected voltage at a prescribed DC voltage when an input signal exceeding a cover range of automatic level control is received.

In such a configuration, in the presence of the limiter circuit, even when the level of the input signal exceeds the cover range, an abnormal rise in the detected voltage can be prevented, thereby shortening the recovery time.

Further, the limiter circuit includes a first transistor with a base to which a DC voltage created by a resistance bleeder is applied and with an emitter which is grounded, and a second transistor with a base to which the emitter of the first transistor is connected and with a collector which is grounded. The emitter of the second transistor is connected to the output from the detected circuit. In this configuration, the detected voltage can be fixed at a stable d.c. voltage with a compensated temperature characteristic.

DETAILED DESCRIPTION OF THE PREFERRED EMBODIMENTS

First Embodiment

Figure 1:
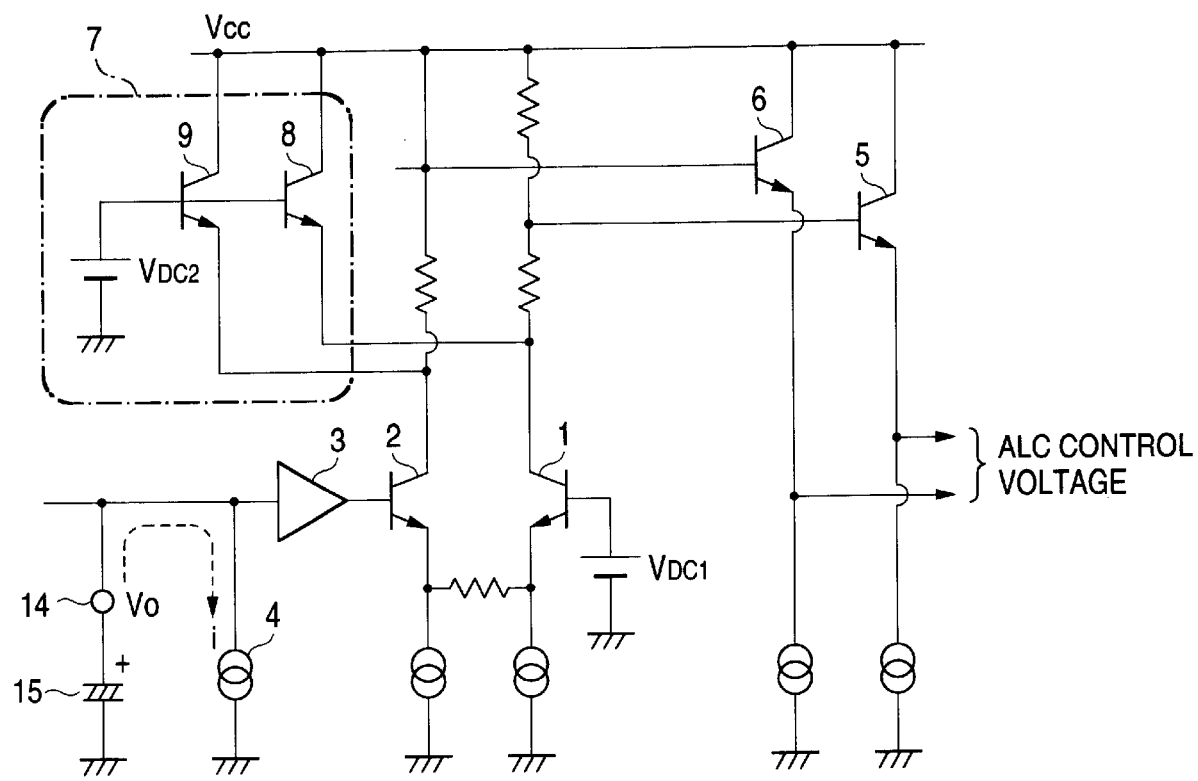
FIG. 1 is a circuit diagram of a comparing circuit in an automatic level control circuit according to a first embodiment of this invention.
Figure 4:
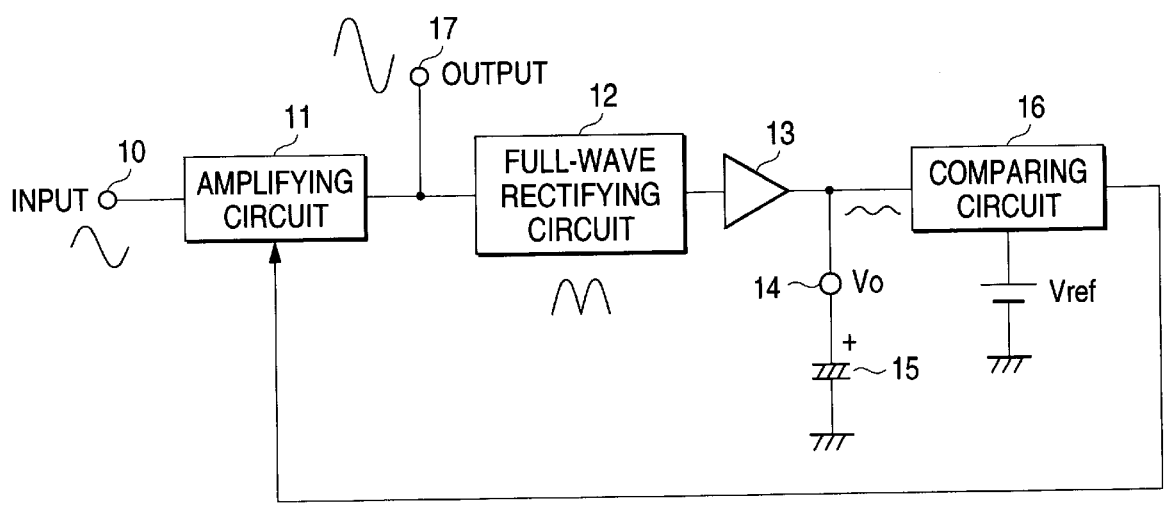
FIG. 4 is a circuit diagram of a conventional automatic level control circuit.
Figure 5:
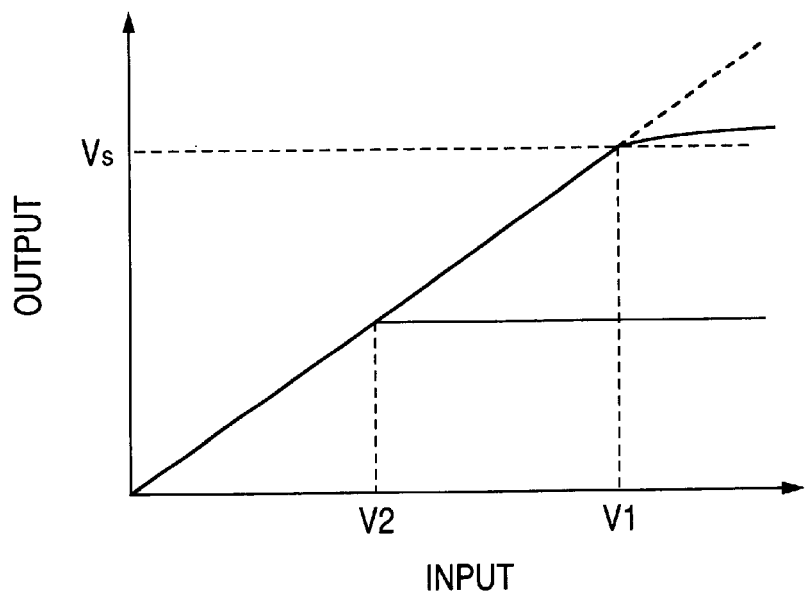
FIG. 5 is a graph showing an input/output characteristic in the conventional automatic level control circuit.
Figure 6A:
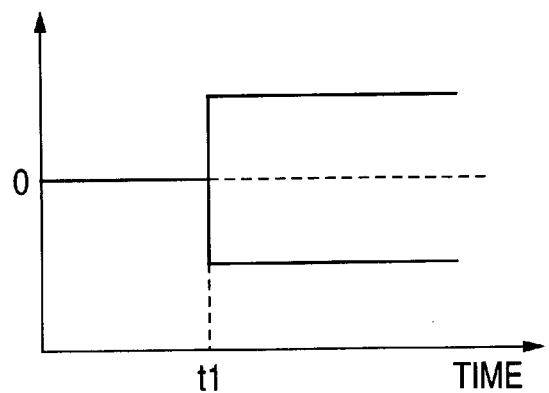
FIGS. 6A and 6B are waveform chart for explaining an attack characteristics.
Figure 6B:
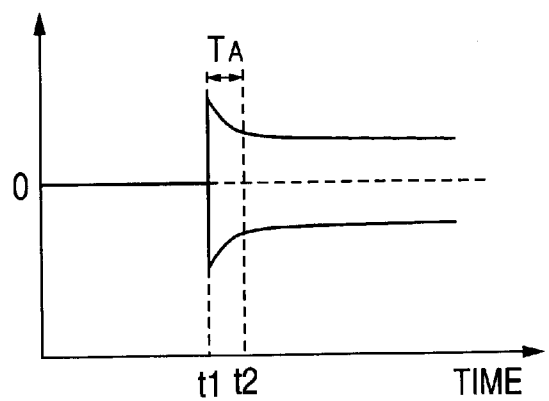
Figure 7A:
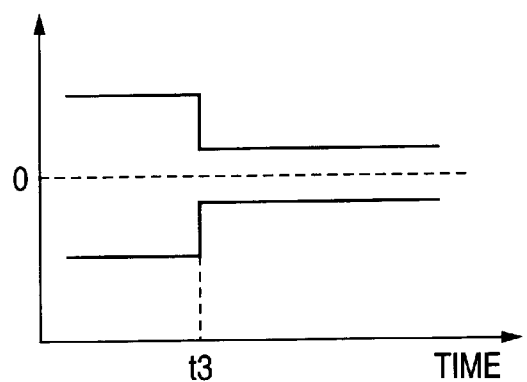
FIGS. 7A and 7B are waveform chart for explaining a recovery characteristic.
Figure 7B:
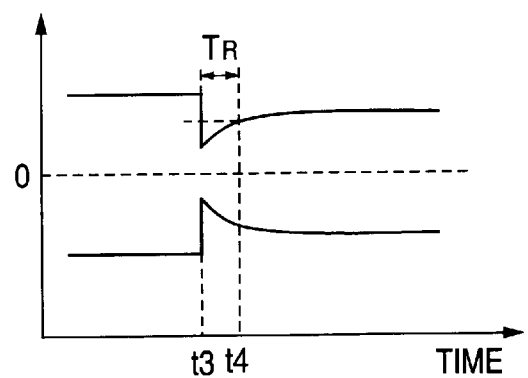
Figure 8:
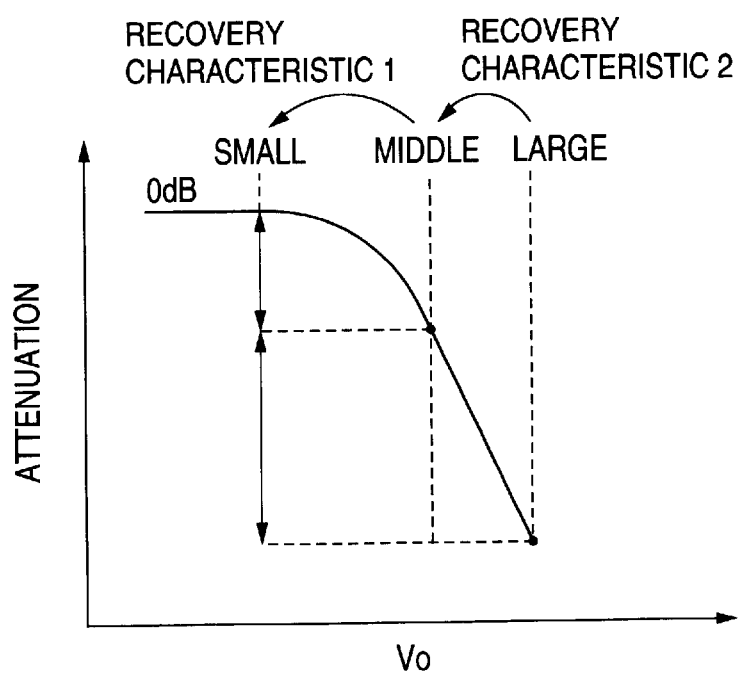
FIG. 8 is a graph showing an attenuating characteristic in a prior art.
Figure 9A:
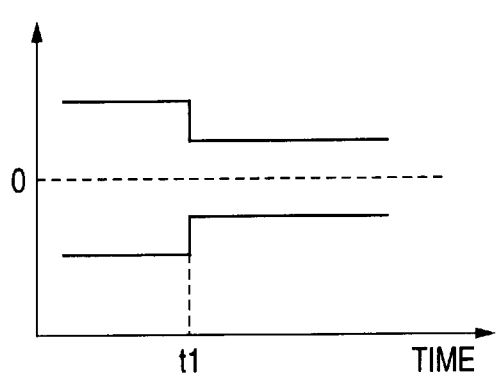
FIGS. 9A and 9B are graph showing the recovery characteristic of the automatic level control circuit according to a prior art.
Figure 9B:
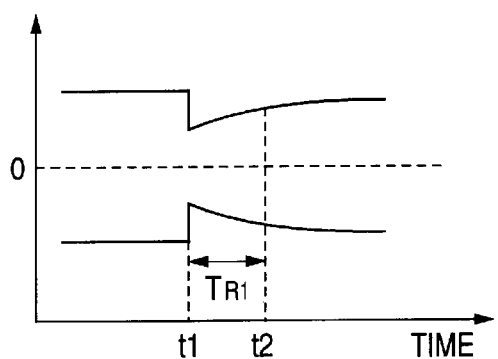
Figure 10A:
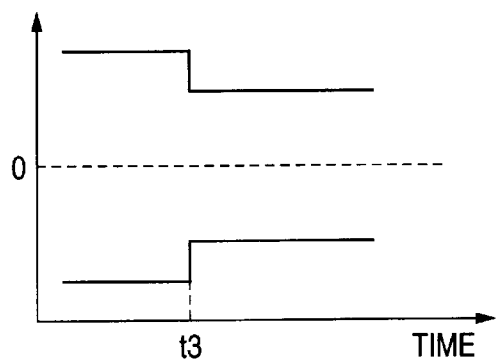
FIGS. 10A and 10B are graph showing the recovery characteristic of the automatic level control circuit according to a prior art.
Figure 10B:
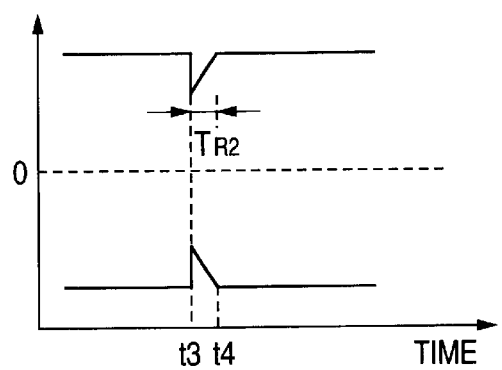
Figure 11:
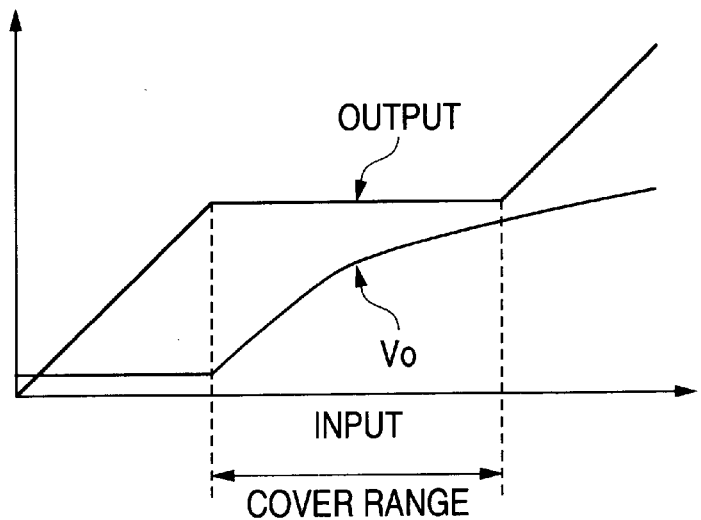
FIG. 11 is an input/output characteristic graph of a conventional automatic level controlling circuit.
Figure 12:
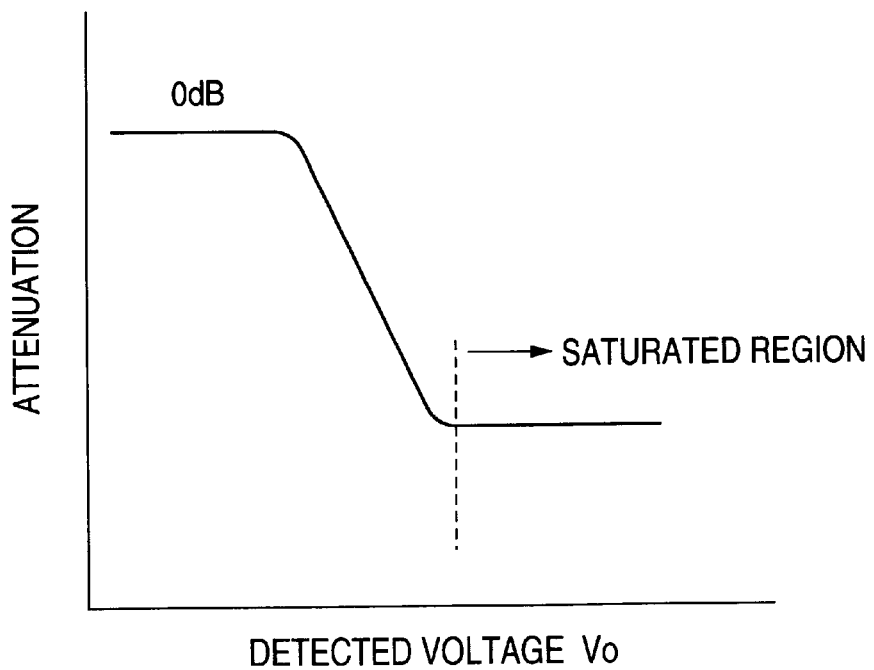
FIG. 12 is a graph showing the relationship between a detected voltage Vo and an attenuating amount.

Now referring to the drawings, an explanation will be given of various embodiments of this invention. FIG. 1 is a detailed circuit diagram of a comparing circuit section in an automatic level control circuit according to a first embodiment of this invention. The remaining circuit configuration, which is the same as the circuit (FIG. 4) explained in connection the prior art, will not be explained here.

In FIG. 1, a comparing circuit 16 includes a pair of NPN-type differential transistors 1 and 2. A DC reference voltage VDC1 from a reference voltage source is applied to the base of the NPN-type differential transistor 1. A detected voltage Vo which appears at the detecting terminal 14 is applied through a buffer amplifier 3 to the base of the NPN-type differential transistor 2 which constitutes the pair with the differential transistor 1. Incidentally, reference numeral 4 denotes a current source which is connected to the detecting terminal 14 and constitutes a current path of a discharging current from the capacitor 15.

The collector of the differential transistor 1 is connected to the base of an NPN-type output transistor 5. The collector of the differential transistor 2 is connected to the base of an NPN-type output transistor 6. A pair of control voltages for ALC are produced from the respective emitters of the output transistors 5 and 6. The pair of control voltages are applied to the amplifying circuit 11 to control its gain.

The feature of this invention resides in that a limiter circuit 7 is provided for limiting the output from the comparing circuit so that the attenuating characteristic curve of the amplifying circuit 11 relative to the detected voltage Vo has an inflection point. Namely, the limiter circuit 7 limits the differential voltage between the outputs from the differential transistors 1 and 2 so that the sensitivity of the attenuating characteristic in a region from the middle level signal to the high level input signal is reduced.

Now, the limiter circuit 7 is composed of a pair of transistors 8 and 9 for voltage limitation. A d.c. reference voltage VDC2 is applied to their bases. Their emitters are connected to the collectors of the differential transistors 1 and 2 which are outputs therefrom.

In the following, an explanation will be given of the recovery operation of the automatic level control circuit incorporating the limiter circuit 7. Now, when the detected voltage Vo has changed from an L level to an H level, the differential transistor 2 turns on. Thus, the collector voltage of the differential transistor 2 attempts to decrease. However, at this time, since the transistor 9 for voltage limitation in the limiter circuit 7 operates, the degree of the decrease is limited to a certain level.

On the other hand, when the detected voltage Vo has changed from the H level to the L level, the differential transistor 1 turns on. Thus, the collector voltage of the differential transistor 1 attempts to decrease. However, in this case also, since the transistor 8 for voltage limitation in the limiter circuit 7 operates, the degree of the decrease is limited to a certain level.

Figure 3:
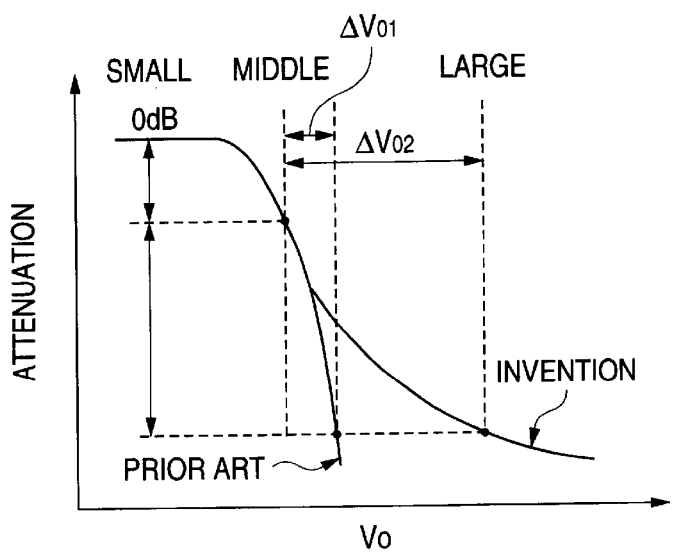
FIG. 3 is a graph showing an attenuating amount.

In this way, as understood from the input/output characteristic shown in FIG. 3, because of the provision of the limiter circuit 7, the difference voltage Vdl between the outputs from the differential transistors 1 and 2 is limited as compared with the difference voltage in the conventional circuit.

Thus, the pair of control voltages produced from the output transistors 5 and 6 are also limited. As a result, as shown in FIG. 3, the attenuating characteristic curve of the amplifying circuit 11 relative to the detected voltage Vo has an inflection point within a range from the middle level signal to the high level signal.

For this reason, when the input signal is switched from the high level signal to the middle level signal, the changing amount in the detected voltage Vo relative to the same attenuating amount results in a lager value of ΔVo2 in the circuit according to this invention than ΔVo1 in the conventional circuit. Namely, since the detected voltage Vo increases in order to acquire the same attenuating amount, the discharging time of the capacitor 15 is lengthened so that the recovery time becomes longer than that in the conventional circuit.

Even when the recovery time is set at the case where the input signal has been switched from the middle level signal into the low level signal (reference input signal), the recovery time when the input signal has been switched from the high level signal into the middle level signal can be prolonged. This permits the signal distortion to be minimized and the "sound breakage" to be relaxed in the case of the audio signal.

Second Embodiment

Figure 13:
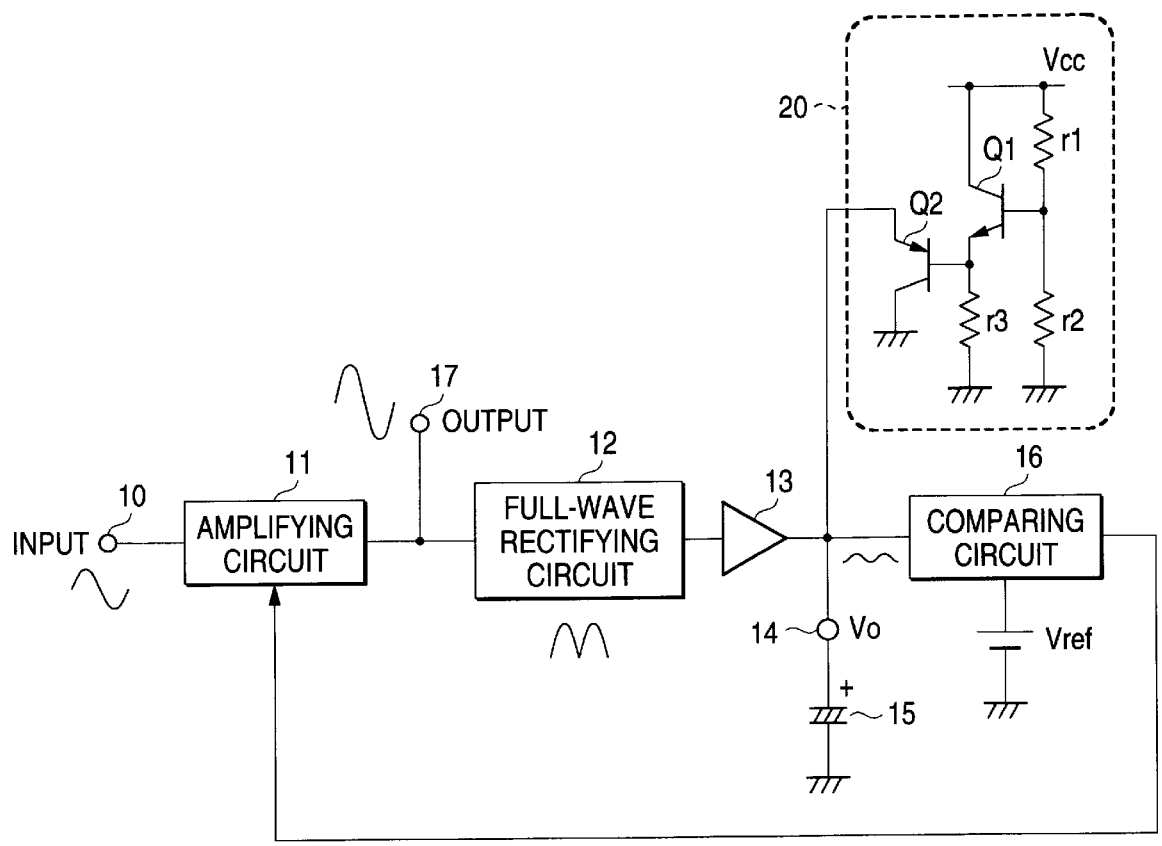
FIG. 13 is a circuit diagram of an automatic level controlling circuit according to a second embodiment of the present invention.
Figure 14:
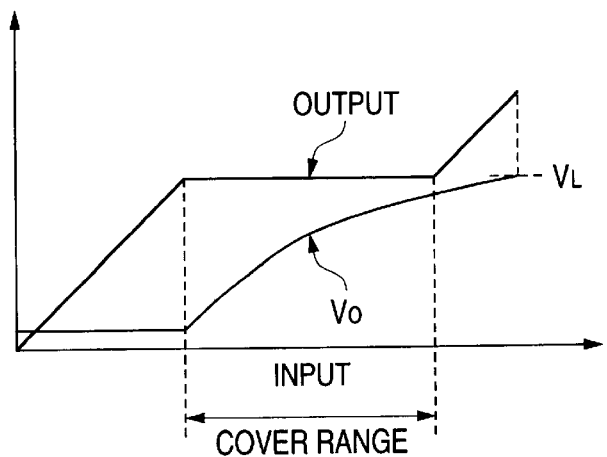
FIG. 14 is an input/output characteristic graph of the automatic level controlling circuit according to a second embodiment of the present invention.

Now referring to the drawings, an explanation will be given of a second embodiment of this invention. FIG. 13 is a circuit diagram of an automatic level controlling circuit according to an embodiment of this invention. In FIG. 13, reference numeral 10 denotes an input terminal. Numeral 11 denotes an amplifying circuit for amplifying an input signal, which includes a differential amplifier using a pair of differential transistors. Numeral 12 denotes a full-wave rectifying circuit for full-wave rectifying an output from the amplifying circuit; 13 a buffer amplifier having a known configuration; and 14 a detecting terminal to which a capacitor 15 is externally attached. The full-wave rectifying circuit 12, buffer amplifier 13 and capacitor 15 constitute a detecting circuit for acquiring a DC detected voltage Vo on the basis of the output from the amplifying circuit 11.

Reference numeral 16 denotes a comparing circuit for comparing a detected voltage Vo and a reference voltage Vref from a DC power source. The comparing circuit 16 produces a control voltage according to a comparison result. The comparing circuit 16 is composed of a first differential transistor with a base to which a reference voltage Vref is applied and a second differential transistor with a base to which the detected voltage Vo is applied. A pair of control voltages are produced from the first and the second differential transistor.

In such a configuration, when the detected voltage Vo exceeds the reference voltage Vref, the gain of the amplifying circuit 11 is regulated on the control voltages so that the level of the output signal at the output terminal 17 is limited to a prescribed level.

Figure 2:
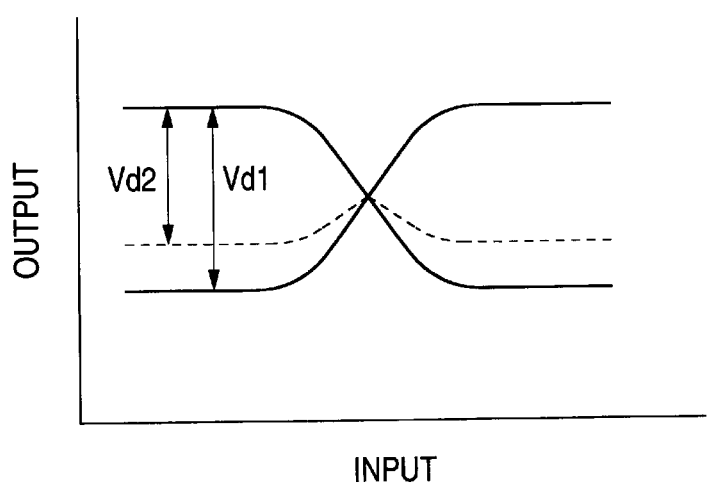
FIG. 2 is an input/output characteristic graph pf a comparing circuit in an automatic level control circuit according to a first embodiment of this invention.

The feature of this invention resides in that a limiter circuit 20 is provided for fixing the detected voltage Vo at a prescribed DC voltage when the input signal exceeding a cover range for automatic level control is supplied to the input terminal 10. Specifically, as shown in FIG. 2, the limiter circuit 20 serves to fix the output signal at a DC voltage $V_L$ when the input signal exceeds the cover range and enters the range where the level of the output signal starts to rise.

The limiter circuit 20 is constructed as an example as follows. A voltage Vx, which is created at a junction point between two resistors r1 and r2 connected in series between a power source Vcc and earth, is applied to the base of an NPN type transistor Q1. The collector of the NPN type transistor Q1 is connected to the power source Vcc and the emitter thereof is grounded. Symbol r3 denotes an emitter resistor. The emitter of the NPN type transistor Q1 is connected to the base of a PNP type transistor Q2. The collector of the PNP type is grounded and the emitter thereof is connected to the detecting terminal 14.

As understood from the configuration of the limiter circuit 20 described above, when the detected voltage Vo exceeds a limiter voltage $V_L = V_X + V_{BE}(Q_2) - V_{BE}(Q_1)$, the limiter circuit 20 operates so that the detected voltage Vo is fixed at the limiter voltage $V_L$. It is now assumed that $V_{BE}(Q_2)$ represents a base-emitter voltage of the PNP type transistor $Q_2$, and $V_{BE}(Q_1)$ represents a base-emitter voltage of the NPN type transistor $Q_1$. As understood from the above equation, the limiter voltage $V_L$ is temperature-compensated.

Further, the limiter circuit 20 should not be limited to the above configuration, but may be modified into a simple configuration of a single transistor with a base to which a DC voltage is applied.

In the automatic level controlling circuit according to this invention, the limiter circuit is provided for limiting the output from the comparing circuit so that the attenuating characteristic curve of the amplifying circuit relative to the detected voltage has an inflection point. In this configuration, the recovery characteristic when the input signal has been switched from the high level signal into the middle level signal can be suitably adjusted. This permits the signal distortion to be minimized and the "sound breakage" to be relaxed in the case of the audio signal.

Further, The automatic level controlling circuit according to this invention is provided with a limiter circuit for fixing a detected voltage to a prescribed DC voltage when an input signal exceeding a cover range for ALC is received. For this reason, even when the level of the input signal exceeds the cover range, an abnormal rise in the detected voltage can be prevented. This permits the time taken for the level of the input signal to restore to a normal signal level (recovery time) to be shortened.

Furthermore, the limiter circuit includes a first transistor with a base to which a DC voltage created by a resistance bleeder is applied and with an emitter which is grounded, and a second transistor with a base to which the emitter of the first transistor is connected and with a collector which is grounded. The emitter of the second transistor is connected to the output from the detected circuit. In this configuration, the detected voltage can be fixed at a stable DC voltage with a compensated temperature characteristic, thereby stabilizing the recovery time.

What is claimed is:

1. An automatic level controlling circuit comprising:
   an amplifying circuit for amplifying an input signal to produce an output signal therefrom;
   a detecting circuit for detecting the output signal from said amplifying circuit to produce a detected voltage in a DC level;
   a comparing circuit for comparing the detected voltage with a first reference voltage to produce a control voltage so that an output level from said amplifying circuit is regulated on the basis of said control voltage; and
   a limiter circuit for limiting the control voltage from said comparing circuit so that an attenuating characteristic curve of said amplifying circuit relative to said detected voltage has an inflection point.

2. An automatic level controlling circuit according to claim 1, wherein said comparing circuit includes a first differential transistor with a base to which said first reference voltage is applied and a second differential transistor with a base to which said detected voltage is applied, and said limiter circuit includes a transistor means for limiting a difference voltage between outputs from said first and second differential transistors.

3. An automatic level controlling circuit according to claim 2, wherein said detected voltage is applied to said second differential amplifier through a buffer amplifier.

4. An automatic level controlling circuit according to claim 2, wherein said transistor means includes a pair of transistors for voltage limitation with their bases to which a second reference voltage is applied and with their emitters which are connected to output terminals from said first and second differential transistors, respectively.

5. An automatic level controlling circuit according to claim 4, further comprising: a first output transistor with a base to which the output from said first differential amplifier is applied and a second output transistor with a base to which the output from said second differential amplifier is applied so that the output level from said amplifying circuit is regulated on the basis of control voltages which are outputted from said first and second output transistors.

6. An automatic level controlling circuit comprising:
   an amplifying circuit for amplifying an input signal to produce an output signal therefrom;
   a detecting circuit for detecting the output signal from said amplifying circuit to produce a detected voltage in a DC level;
   a comparing circuit for comparing the detected voltage with a first reference voltage to produce a control voltage so that an output level from said amplifying circuit is regulated on the basis of said control voltage; and
   a limiter circuit for fixing said detected voltage at a prescribed DC voltage when an input signal exceeding a cover range of automatic level control is received.

7. An automatic level controlling circuit according to claim 6, wherein said limiter circuit includes a first transistor with a base to which a DC voltage created by a resistance bleeder is applied and with an emitter which is grounded, and a second transistor with a base to which the emitter of the first transistor is connected and with a collector which is grounded, and the emitter of the second transistor is connected to the output from the detected circuit.

8. An automatic level controlling circuit comprising:
   an amplifying circuit for amplifying an input signal to produce an output signal therefrom and capable of regulating a gain;
   a full-wave rectifying circuit for full-wave rectifying an output from said amplifying circuit;
   a time-constant circuit including a capacitor and a charging/discharging resistor, said time-constant circuit serving to convert an output from said full-wave rectifying circuit into a detected voltage in a DC level;
   a comparing circuit for comparing an output from said time-constant circuit with a reference voltage to produce a control voltage so that the gain of said amplifying circuit is controlled on the basis of said control voltage to regulate the level of the output from said amplifying circuit; and
   a limiter circuit for fixing said detected voltage at a prescribed DC voltage when an input signal exceeding a cover range of automatic level control is received.

9. An automatic level controlling circuit according to claim 8, wherein said limiter circuit includes a first transistor with a base to which a DC voltage created by a resistance bleeder is applied and with an emitter which is grounded, and a second transistor with a base to which the emitter of the first transistor is connected and with a collector which is grounded, and wherein the emitter of the second transistor is connected to the output from the time-constant circuit.

* * * * *